United States Patent [19]

Coffey et al.

[11] Patent Number: 5,476,680
[45] Date of Patent: Dec. 19, 1995

[54] METHOD FOR MANUFACTURING GRANULAR MULTILAYER MANGETORESISTIVE SENSOR

[75] Inventors: Kevin R. Coffey, San Jose; James K. Howard, Morgan Hill; Todd L. Hylton, San Jose; Michael A. Parker, Fremont, all of Calif.

[73] Assignee: International Business Machines Corporation, Armonk, N.Y.

[21] Appl. No.: 422,735

[22] Filed: Apr. 14, 1995

Related U.S. Application Data

[62] Division of Ser. No. 400,622, Mar. 6, 1995, which is a continuation of Ser. No. 56,331, Apr. 30, 1993, abandoned.

[51] Int. Cl.$^6$ ................................................ B05D 5/12
[52] U.S. Cl. .................... 427/130; 427/131; 427/132; 427/376.7; 427/404
[58] Field of Search ................................ 427/130, 131, 427/132, 376.7, 404

[56] References Cited

U.S. PATENT DOCUMENTS

| | | | |
|---|---|---|---|
| 4,879,619 | 11/1989 | Fontana et al. | 360/113 |
| 4,896,235 | 1/1990 | Takino et al. | 360/113 |
| 4,949,039 | 8/1990 | Grunberg | 324/252 |
| 5,005,096 | 4/1991 | Krounbi et al. | 360/113 |
| 5,159,513 | 10/1992 | Dieny et al. | 360/113 |

OTHER PUBLICATIONS

D. A. Thompson et al., "Thin Film Magnetoresistors in Memory, Storage, and Related Application", IEEE Transactions on Magnetics, vol., Mag–11, No. 4, Jul. 1975, pp. 1039–1050.

H. Suyama et al., "Thin Film MR Head For High Density Rigid Disk Drive", IEEE Transacions on Magnetics, vol. 24, No. 6, Nov. 1988, pp. 2612–2614.

John Q. Xiao et al., "Giant Magnetoresistance in Nonmultilayer Magnetic Systems", Physical Review Letters, vol. 68, No. 25, Jun. 22, 1992, pp. 3749–3752.

A. E. Berkowitz et al., "Giant Magnetoresistance in Heterogeneous Cu–Co Alloys", Physical Review Letters, vol. 68, No. 25, Jun. 22, 1992, pp. 3745–3748.

J. A. Barnard et al., "'Giant' magnetoresistance observed in single layer Co–Ag alloy films", Letter to the Editor, Journal of Magnetism and Magnetic Materials, 114 (1992), pp. L230–L234, (no month avail.)

J. S. Jiang et al., "Magnetic properties and giant magnetoresistance of granular permalloy", Appl. Phys. Lett. 61(19), Nov. 9, 1992, pp. 2362–2364.

B. Rodmacq et al., "Magnetoresistive properties and thermal stability of Ni–Fe/Ag multilayers", Journal of Magnetism and Magnetic Materials, 118 (1993), pp. L11–L16 (no month avail.).

*Primary Examiner*—Bernard Pianalto
*Attorney, Agent, or Firm*—Leslie G. Murray

[57] ABSTRACT

A magnetoresistive read sensor incorporates a granular multilayer sensing element comprising a plurality of layers of generally flat particles of a ferromagnetic material embedded in a nonmagnetic electrically conductive material. A bias layer separated from the magnetoresistive sensing element by a spacer layer provides a magnetic field to bias the magnetoresistive sensing element at a desired non-signal point. The ferromagnetic and the nonmagnetic materials are mutually immiscible, or may be miscible or partially miscible and processed in a manner to control interdiffusion. The magnetoresistive sensing element is formed by alternatively despositing layers of ferromagnetic material and layers of nonmagnetic conductive material on a substrate and then annealing the structure. During the annealing cycle, the layers of nonmagnetic material above and below the ferromagnetic layers penetrate at grain boundaries and break the continuity of the ferromagnetic layers to form layers or planes of ferromagnetic particles embedded in a matrix of nonmagnetic material.

17 Claims, 10 Drawing Sheets

METHOD FOR MANUFACTURING GRANULAR MULTILAYER MANGETORESISTIVE SENSOR

This is a divisional of application Ser. No. 08/400,622 filed on Mar. 6, 1995, which is a continuation application of Ser. No. 08/056,331 field on Apr. 30, 1993, now abandoned, in the name of K. R. Coffey, J. K. Howard, T. L. Hylton, M. A. Parker.

BACKGROUND OF THE INVENTION

The present invention relates generally to magnetic transducers for reading information signals recorded in a magnetic medium and, more particularly, to a magnetoresistive read sensor based on the giant magnetoresistance exhibited by multiple layers of individual ferromagnetic particles fixed in a matrix of nonmagnetic conductive material.

It is well-known in the prior art to utilize a magnetic read transducer referred to as a magnetoresistive (MR) sensor or head for reading high density recorded data from magnetic media. An MR sensor detects magnetic field signals through the resistance changes of a read element fabricated of a magnetic material as a function of the strength and direction of magnetic flux being sensed by the read element. These prior art MR sensors operate on the basis of the anisotropic magnetoresistive (AMR) effect in which a component of the read element resistance varies as the square of the cosine ($cos^2$) of the angle between the magnetization and the direction of sense current flow through the read element. A more detailed description of the AMR effect can be found in "Memory, Storage, and Related Applications", D. C. Thompson et al., IEEE Trans. Mag. MAG-11, p. 1039 (1975).

U.S. Pat. No. 4,896,235 entitled "Magnetic Transducer Head Utilizing Magnetoresistance Effect", granted to Takino et al on Jan. 23, 1990, discloses a multilayered magnetic sensor which utilizes the AMR effect and comprises first and second magnetic layers separated by a non-magnetic layer and in which at least one of the magnetic layers is of a material exhibiting the AMR effect. The easy axis of magnetization in each of the magnetic layers is set perpendicular to the applied magnetic signal such that the MR sensor element sense current provides a magnetic field in the magnetic layers parallel to the easy axis thus eliminating or minimizing Barkhausen noise in the sensor. "Thin Film MR Head for High Density Rigid Disk Drive"by H. Suyama et al, IEEE Trans. Man., Vol. 24, No. 6, 1988 (pages 2612–2614) discloses an multilayered MR sensor similar to that disclosed by Takino et al.

A second, different and more pronounced magnetoresistive effect has also been described in which the change in resistance of a layered magnetic sensor is attributed to the spin-dependent transmission of conduction electrons between ferromagnetic layers via a nonmagnetic layer separating the ferromagnetic layers and the accompanying spin-dependent scattering at the layer interfaces. This magnetoresistive effect is variously referred to as the "giant magnetoresistive" or "spin valve" effect. Such a magnetoresistive sensor fabricated of the appropriate materials provides improved sensitivity and greater change in resistance than observed in sensors utilizing the AMR effect. In this type of MR sensor, the in-plane resistance between a pair of ferromagnetic layers separated by a non-magnetic layer varies as the cosine (cos) of the angle between the magnetization in the two layers.

U.S. Pat. No. 4,949,039 to Grunberg describes a layered magnetic structure which yields enhanced MR effects caused by antiparallel alignment of the magnetization in the magnetic layers. As possible materials for use in the layered structure, Grunberg lists ferromagnetic transition metals and alloys, but does not indicate preferred materials from the list for superior MR signal amplitude. Grunberg further describes the use of antiferromagnetic-type exchange coupling to obtain the antiparallel alignment in which adjacent layers of ferromagnetic materials are separated by a thin interlayer of Cr or Y.

Co-pending U.S. Patent application Ser. No. 07/625,343 filed Dec. 11, 1990 now U.S. Pat. No. 5,206,590, assigned to the instant assignee, discloses an MR sensor in which the resistance between two uncoupled ferromagnetic layers is observed to vary as the cosine of the angle between the magnetizations of the two layers and which is independent of the direction of current flow through the sensor. This mechanism produces a magnetoresistance that is based on the spin valve effect and, for selected combinations of materials, is greater in magnitude than the AMR.

U.S. Pat. No. 5,159,513 granted to Dieny et al on Oct. 27, 1992, assigned to the instant assignee, discloses an MR sensor based on the above-described spin valve effect which includes two thin film layers of ferromagnetic material separated by a thin film layer of anon-magnetic metallic material wherein at least one of the ferromagnetic layers is of cobalt or a cobalt alloy. The magnetization of the one ferromagnetic layer is maintained perpendicular to the magnetization of the other ferromagnetic layer at zero externally applied magnetic field by exchange coupling to an antiferromagnetic layer.

The spin valve structures described in the above-cited U.S. Patents require that the direction of magnetization in one of the two ferromagnetic layers be fixed or "pinned" in a selected orientation such that under non-signal conditions the direction of magnetization in the other ferromagnetic layer is oriented perpendicular to the pinned layer magnetization. Additionally, in both the AMR and spin valve structures, in order to minimize Barkhausen noise, it is necessary to provide a longitudinal bias field to maintain at least the sensing portion of the read element in a single magnetic domain state. Thus, a means for both fixing the direction of the magnetization and providing a longitudinal bias field is required. For example, as described in the above-cited patent application and patents, an additional layer of antiferromagnetic material can be formed in contact with the ferromagnetic layer to provide an exchange-coupled bias field. Alternatively, an adjacent magnetically hard layer can be utilized to provide hard bias for the ferromagnetic layer.

More recently, the giant magnetoresistance effect has been observed in both single- and multi-layer heterogeneous films of ferromagnetic particles embedded in a nonmagnetic metallic matrix. GMR has been reported in inhomogeneous, single layer alloy systems such as cobalt-copper (Co-Cu), cobalt silver (Co-Ag) and nickel-iron-silver (NiFe-Ag), For example, see "GIANT MAGNETORESISTANCE IN NON-MULTILAYER MAGNETIC SYSTEMS", John Q. Xiao et al, *PHYSICAL REVIEW LETTERS*, Vol. 68, No. 25, pages 3749–3752 (Jun. 22, 1992); "GIANT MAGNETORESISTANCE IN HETEROGENEOUS CU-CO ALLOYS", A. E. Berkowitz et al, *PHYSICAL REVIEW LETTERS*, Vol. 68, No. 25, pages 3745–3748 (Jun. 22, 1992); "'GIANT' MAGNETORESISTANCE OBSERVED IN SINGLE LAYER CO-AG ALLOY FILMS", J. A. Barnard et al, Letter to the Editor, *JOURNAL OF MAGNETISM AND MAGNETIC*

*MATERIALS*, 114 (1992), pages L230–L234; and J. Jaing et al, *APPLIED PHYSICS LETTERS*, Vol. 61, page 2362 (1992). The Co alloys are of materials that are immiscible at low temperatures. However, annealing the metastable alloy causes the formation of fine Co precipitates, i.e., "grains", in a Cu or Ag matrix. The MR effect appears to vary inversely with the diameter of the average particle diameter. While the "granular" alloy is an attractive approach to achieve a GMR sensor with only a single film in contrast to the more complex multilayered spin valve sensors, the Co alloys require saturation fields of several thousand Oersted (Oe) and would not be useful in a low field MR sensor application. Recently reported work with granular NiFe in a Ag matrix has yielded MR ((delta R)/R) of 10 percent at room temperature with the half-height width of the MR peak of about 400 Oe. More recent work with annealed NiFe multilayers in a Ag matrix has yielded a granular multilayer structure which exhibits an MR of approximately 17 percent at room temperature with a saturation field of about 100 Oe. See "MAGNETORESISTIVE PROPERTIES AND THERMAL STABILITY OF NI-FE/AG MULTILAYERS", B. Rodmacq et al, Letter to the Editor, *JOURNAL OF MAGNETISM AND MAGNETIC MATERIALS*, 118 (1993), pages L11–L16. Although the saturation fields for the single- and multiple-layer NiFe alloys are lower than the reported value for Co alloys, it is still above the range that is useful for MR devices (about 10 Oe or less).

SUMMARY OF THE INVENTION

Thus, it is a principal object of the present invention to provide a low field MR magnetic sensor based on the GMR effect in granular multilayer structures.

Another object of the present invention is to provide an MR sensor in which it is not required to provide additional structure means for fixing the magnetization orientation in one or more ferromagnetic layers or to provide a longitudinal bias field for the field sensing element.

These and other objects and advantages are attained in accordance with the principles of the present invention, in which an MR read sensor incorporating a granular multilayer sensing element comprises a layered structure formed on a suitable substrate including a magnetoresistive sensing element comprising a plurality of layers of flat plate- or disc-like particles or islands of a ferromagnetic material embedded in a nonmagnetic electrically conductive material and a bias layer for providing a magnetic field to bias the magnetoresistive sensing element at a desired non-signal point, the bias layer being separated from the magnetoresistive sensing element by a nonmagnetic spacer layer disposed therebetween. The ferromagnetic material and the nonmagnetic material are chosen such that the two materials are mutually immiscible. Alternatively, the magnetic and non-magnetic materials can be miscible or partially miscible under equilibrium conditions processed in a controlled manner to limit interdiffusion. The magnetoresistive sensing element is formed by alternatively depositing layers of ferromagnetic material and layers of nonmagnetic conductive material on a substrate, over the bias and spacer layers. When deposition is complete, the multilayer magnetoresistive sensing element is annealed. During the annealing cycle, the ferromagnetic layers break up into flat plate-like particles as the immiscible layers of nonmagnetic material above and below the ferromagnetic layers penetrate at grain boundaries and break the continuity of the ferromagnetic layers to form layers or planes of ferromagnetic particles embedded in a matrix of nonmagnetic material. The structure can be further annealed in the presence of an applied magnetic field to orient the preferred or easy magnetic axis of the magnetoresistive sensing element parallel to the width of a data track on an adjacent storage medium. Each layer of ferromagnetic particles behaves as a collection of magnetic domains with the magnetic moments being randomly oriented. When a magnetic field is applied in the plane of the particle layers, the magnetic moments will align parallel to the applied field reducing the resistivity of the magnetoresistive sensing element. A current source provides a sense current to the MR sensor which generates a voltage drop across the sensing element proportional to the variations in the resistance of the MR sensor due to the rotation of the magnetic moments in the layers of ferromagnetic particles as a function of the applied external magnetic field being sensed.

Thus, the present invention provides a MR sensor in which the magnetoresistive sensing element constitutes a plurality of magnetic domains in which the individual magnetic moments rotate in response to an applied magnetic signal. Since the response is the result of the rotation of the magnetic moments with limited domain wall motion, the need for a longitudinal bias field to minimize Barkhausen noise is eliminated.

BRIEF DESCRIPTION OF THE DRAWINGS

The foregoing and other objects, features and advantages of the present invention will be apparent from the following detailed description of the preferred embodiments of the invention, reference being made to the accompanying drawings, in which like reference numerals indicate like parts and in which.

DETAILED DESCRIPTION OF THE PREFERRED EMBODIMENTS

Figure 1:
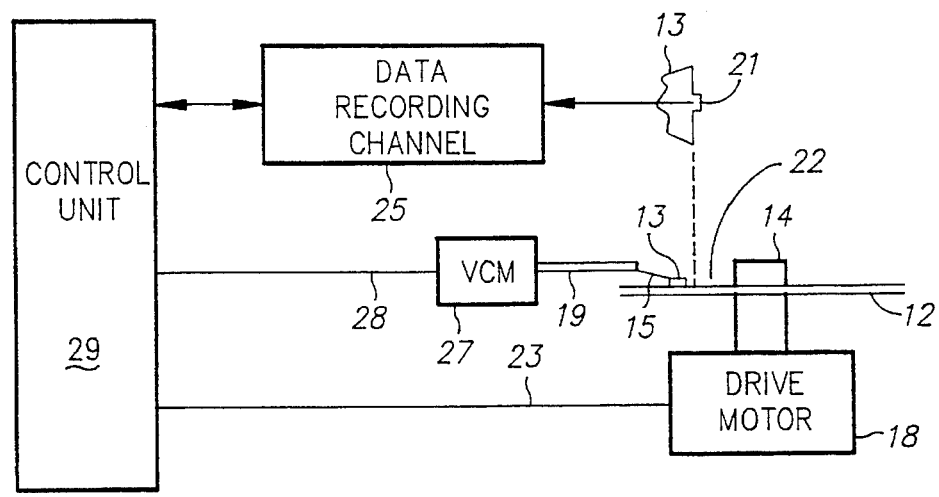
FIG. 1 is a simplified block diagram of a magnetic disk storage system embodying the present invention.

Referring now to FIG. 1, although the invention is described as embodied in a magnetic disk storage system as shown in FIG. 1, it will be apparent that the invention is also applicable to other magnetic recording systems such as a magnetic tape recording system, for example, or other applications in which a sensor is utilized to detect a magnetic field. A magnetic disk storage system comprises at least one rotatable magnetic disk 12 supported on a spindle 14 and rotated by a disk drive motor 18 with at least one slider 13 positioned on the disk 12, each slider 13 supporting one or more magnetic read/write transducers 21, typically referred to as read/write heads. The magnetic recording media on each disk is in the form of an annular pattern of concentric data tracks (not shown) on disk 12. As the disks rotate, the sliders 13 are moved radially in and out over the disk surface 22 so that the heads 21 may access different portions of the disk where desired data is recorded. Each slider 13 is attached to an actuator arm 19 by means of a suspension 15. The suspension 15 provides a slight spring force which biases the slider 13 against the disk surface 22. Each actuator arm 19 is attached to an actuator means 27. The actuator means as shown in FIG. 1 may be a voice coil motor (VCM), for example. The VCM comprises a coil moveable within a fixed magnetic field, the direction and velocity of the coil movements being controlled by the motor current signals supplied by a controller.

During operation of the disk storage system, the rotation of the disk 12 generates an air bearing between the slider 13 and the disk surface 22 which exerts an upward force or lift on the slider. The air bearing thus counterbalances the slight spring force of the suspension 15 and supports the slider 13 off and slightly above the disk surface by a small, substantially constant spacing during operation.

The various components of the disk storage system are controlled in operation by control signals generated by control unit 29, such as access control signals and internal clock signals. Typically, the control unit 29 comprises logic control circuits, storage means and a microprocessor, for example. The control unit 29 generates control signals to control various system operations such as drive motor control signals on line 23 and head position and seek control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system, and the accompanying illustration of FIG. 1 are for representation purposes only. It should be apparent that disk storage systems may contain a large number of disks and actuators, and each actuator may support a number of sliders.

Figure 4:
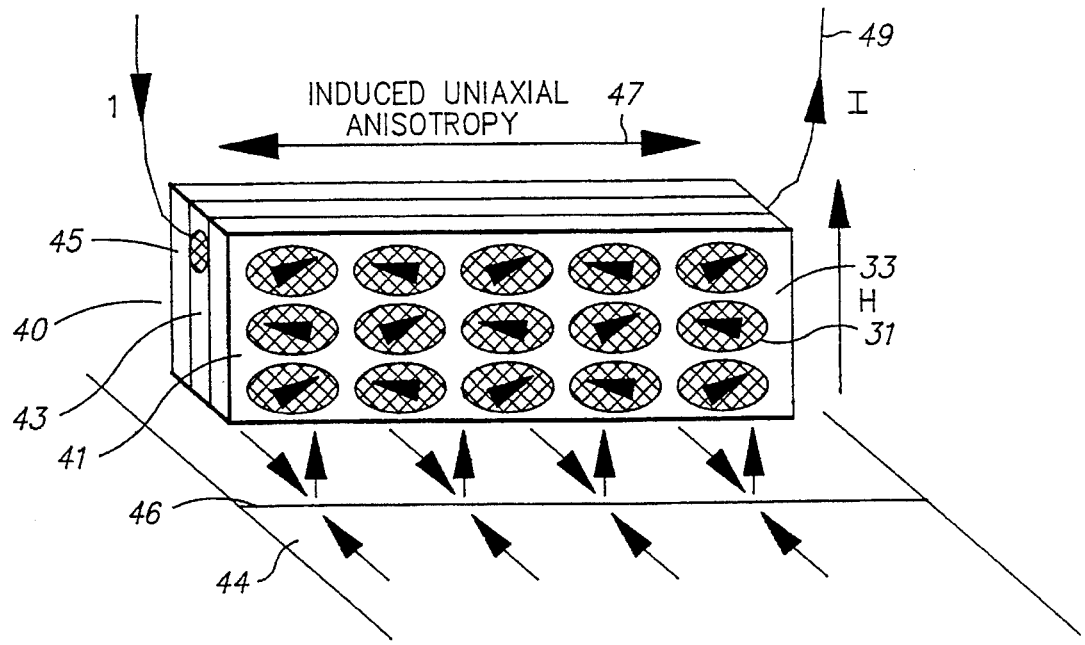
FIG. 4 is a perspective view of the annealed multilayer sensing element shown in FIG. 2 illustrating the orientation of the individual magnetic domains.
Figure 2:
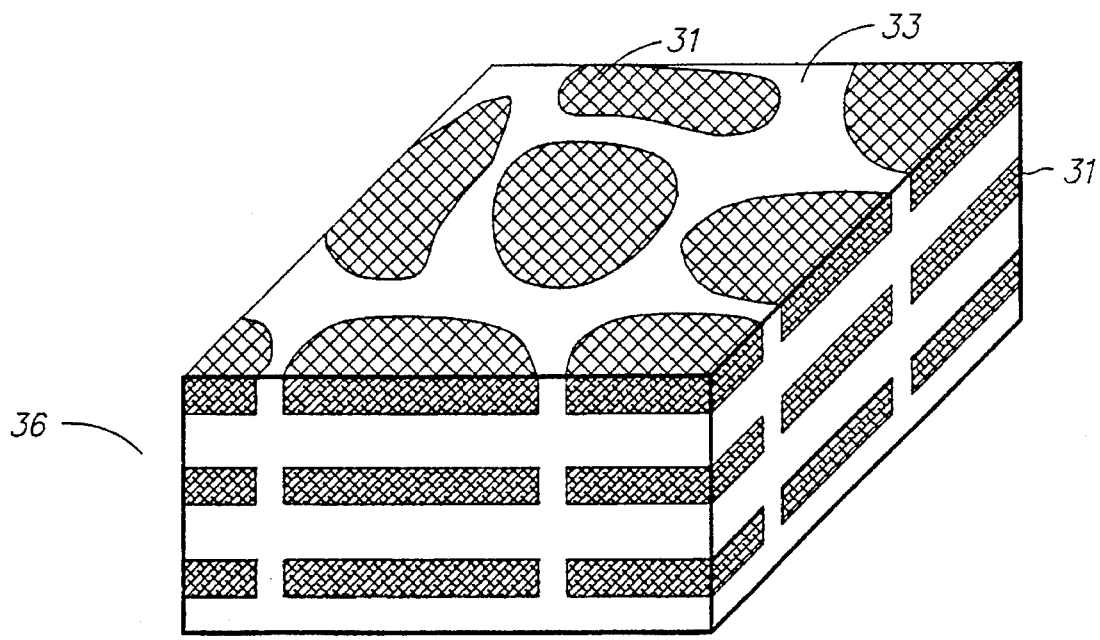
FIG. 2 is a view in perspective of a preferred embodiments of a granular multilayer magnetoresistive sensing element according to the principles of the present invention.
Figure 3:
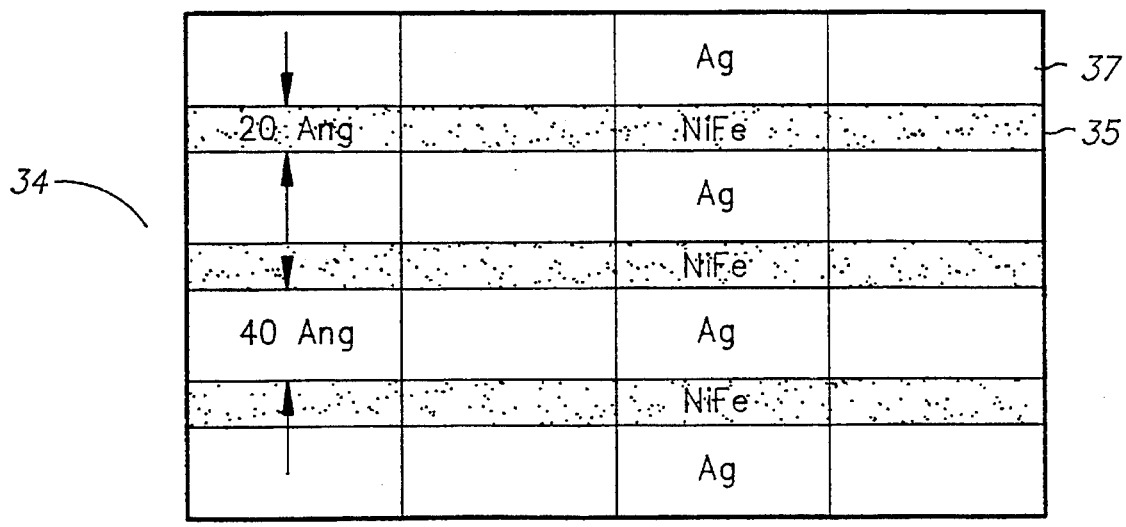
FIG. 3 is a cross-sectional view illustrating the multilayer sensing element shown in FIG. 2 prior to the anneal process.

Referring now to FIGS. 2, 3 and 4, FIG. 2 is a perspective view illustrating a granular multilayer magnetic structure 30 comprising layers of generally flat or oblate "pancake" or disc-like magnetic particles or islands 31 suspended or embedded in a nonmagnetic matrix 33 of an electrically conductive material. As shown in FIG. 3, a multilayer structure 34 of layers 35 of a ferromagnetic material alternatively deposited with layers 37 of a nonmagnetic conductive material is prepared, such as by sputter deposition, with the thickness of the individual layers being controlled by a quartz monitor, for example. The magnetic material and the nonmagnetic material are chosen such that the two materials are immiscible. Alternatively, the magnetic and non-magnetic materials can be miscible or partially miscible under equilibrium conditions when processed in a controlled manner to limit interdiffusion. After deposition, the structure 34 is then annealed. During the annealing process, the magnetic layers 35 break up into flat plate-like particles 31 as the immiscible layers 37 above and below the magnetic layers 35 penetrate at grain boundaries and break the continuity of the magnetic layers 35 thus forming layers or planes of magnetic particles 31 embedded in a matrix of nonmagnetic material 33.

Other deposition or film-forming processes may also be used, such as, plating, ion deposition, evaporation, or pastes or other mechanical methods. Additionally, it is not required that the anneal process by performed after completion of the deposition process. Deposition may be done at elevated temperatures or on heated substrates to achieve the desired granular magnetic structures.

A substantial MR effect is achieved in the granular structure 30 if the spacing between the magnetic particles 31 is comparable to the mean free path of conduction electrons in the matrix material, preferably being less than the electron mean free path. As in the well-known magnetic/nonmagnetic multilayer spin valve systems described above, the origin of the MR observed in the granular multilayer structure 30 is believed to be primarily due to spin-dependent scattering of conduction electrons traversing the matrix between the magnetic regions or particles 31. While it is recognized that larger particles may comprise more than one or multiple magnetic moments, for analysis, it can be assumed that each of the flat particles 31 behave as if it constituted a single magnetic moment or domain, as shown in FIG. 4. If the magnetic moments of the particles 31 are randomly oriented, spin dependent scattering from particle to particle is increased resulting in a relatively high resistivity for the structure 30. The greatest resistivity is observed when the magnetic moments of the particles 31 are oriented antiparallel from layer to layer. On the other hand, if the magnetic moments of the particles 31 are aligned in a parallel orientation, the resistance decreases to a relatively low value. While it is recognized that magnetostatic and exchange coupling exists between the particles in the matrix, a single particle model analysis which neglects interactions between particles is sufficient to show the that the observed MR is strongly dependent on the particle 31 size, shape and anisotropy.

It can be shown that that an oriented collection of flat plate-like magnetic particles are much more easily polarized, i.e., aligned, than a similar collection of spherical magnetic particles. Additionally, a high width to thickness ratio reduces the effects of shape anisotropy on the field required for alignment of the particle moments. For example, for a plate thickness of 30 Angstroms (A), a major axis dimension of approximately 500 A is required. This particle size is quite large when compared to the 40 A particle size reported in the above-cited literature with large values of MR (and accompanying large values for the saturation fields).

With continuing reference to FIG. 4, a conceptual diagram of an MR sensor 40 arranged in sensing relationship with a data track 44 defined on a magnetic recording media surface (not shown) is illustrated. The MR sensor 40 comprises an MR sensing element 41, a bias layer 45 separated from the sensing element 41 by a nonmagnetic spacer layer 43 and is connected to a current source (not shown) by conductors 49 to provide a sensing current I to the MR sensor 40. The MR sensing element 41 is a granular multilayer magnetic structure as described above with reference to FIGS. 2 and 3 including an number of layers or planes of plate-like particles 31 in a metallic conductive matrix 33. The magnetic moments of the particles 31 may be partially oriented along an induced anisotropic axis, as shown by arrow 47. An anisotropic axis may be induced in the MR sensing element 41 by a second annealing cycle in the presence of a magnetic field in the direction of the desired anisotropic axis, as is known in the art. The bias field provided by the bias layer 45 will further align the moments of the particles 31 in a desired direction to adjust the operating point of the MR sensor at a linear portion of its response characteristic. The MR sensor 40 is suspended above a data track 44 by a suspension apparatus (not shown) such that the magnetic field H at a data transition 46 will be applied in the plane of the sensing element 41. When the field H is intercepted, the magnetic moments rotate to align with the applied field H resulting in a decrease in the resistivity in the sensing element 41. Since rotation of the magnetization of the magnetic particles occurs with limited domain wall motion, a longitudinal bias field for the sensing element is not required.

Figure 5:
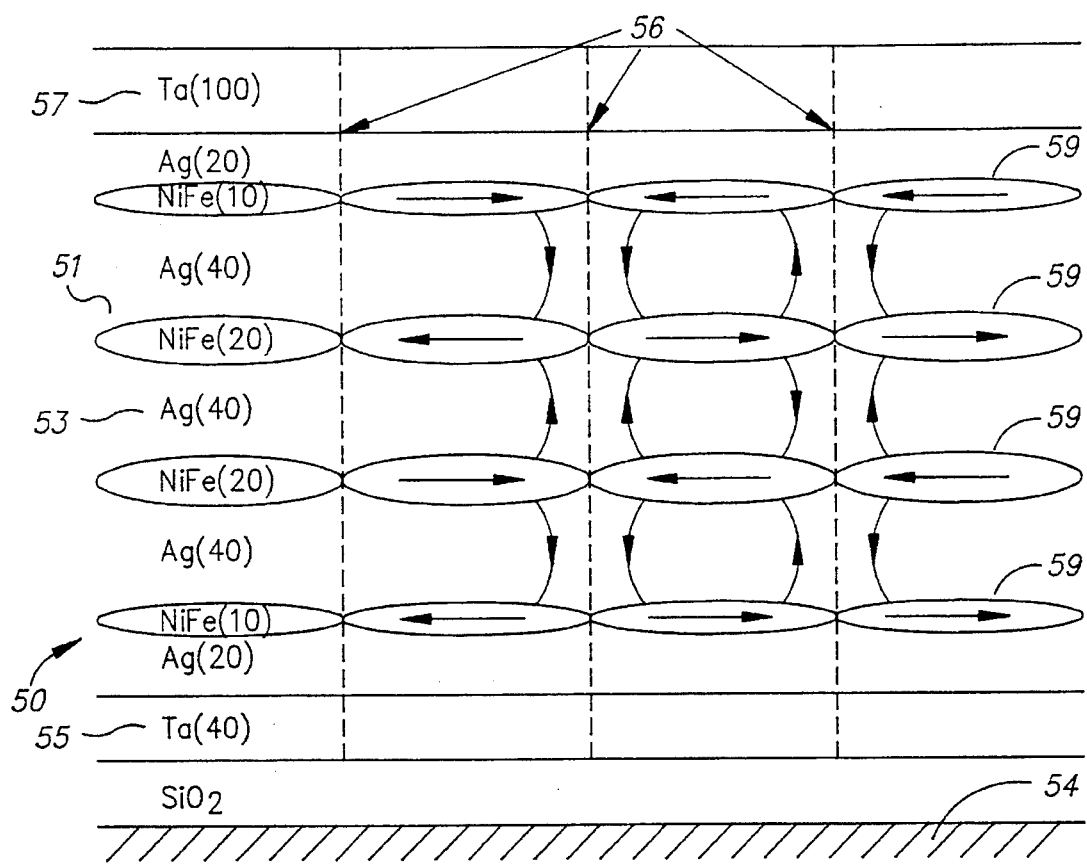
FIG. 5 is a cross-sectional view illustrating a specific embodiment after anneal of the multilayer sensing element shown in FIG. 2.
Figure 6:
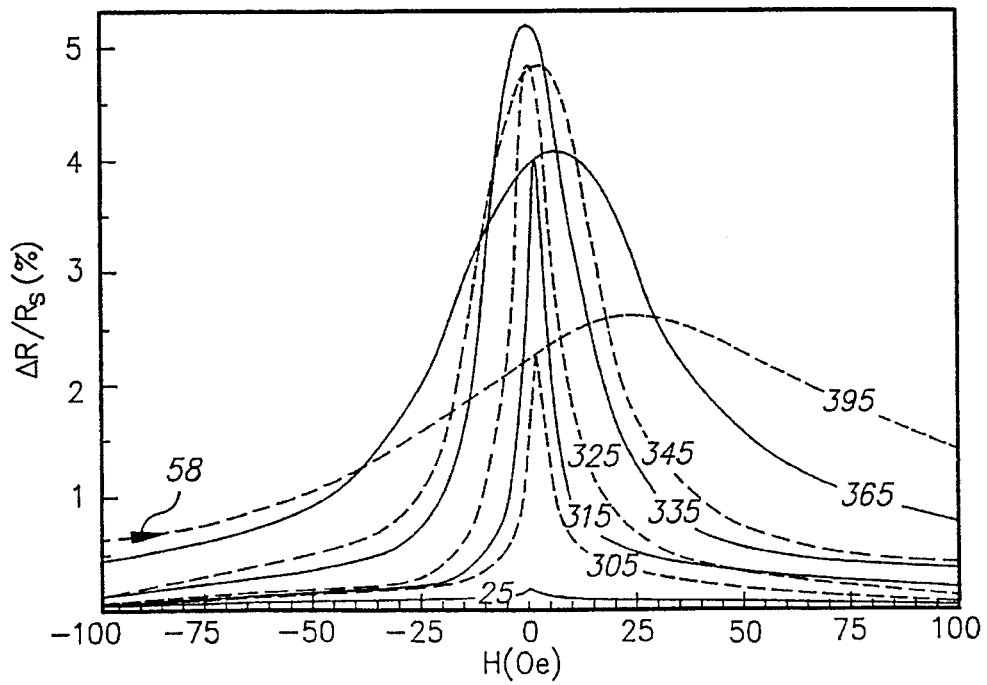
FIG. 6 is a graph illustrating the magnetoresistance versus an applied magnetic field as a function of anneal temperature for a specific embodiment of the multilayer sensing element shown in FIG. 2.

Referring now also to FIGS. 5 and 6, a multilayer structure 50 of layers 51 of a ferromagnetic material alternatively deposited with layers 53 of a nonmagnetic conductive material having the form Ag(y/2)/NiFe(x/2)[NiFe(x)/Ag(y)]$_{n-1}$/NiFe(x/2)/Ag(v/2) deposited over a Ta underlayer 55 on an oxidized silicon (Si) substrate 54. A 100 A Ta capping layer 57 minimizes oxidation during the anneal process. The anneal process promotes penetration of the non-magnetic material, Ag layers 53, at the grain boundaries 56 of the magnetic layers 51 producing discontinuities in the magnetic layers to provide planes of flat, island-like particles 59. Thus, each layer of magnetic material is broken-up into a multidomain or granular state. Within a magnetic layer, as long as the layer of magnetic material is discontinuous, the spacing between the particles does not appear to strongly influence the observed magnetoresistance for the structure provided that the spacing is less than the mean free path for the conduction electrons in the non-magnetic material. Discontinuities in the magnetic layers 51, particularly if the discontinuities are arranged into columns from layer to layer in the structure, prompts an interlayer magnetostatic interaction that strongly favors antiferromagnetic order.

No significant MR was observed in any structure examined prior to annealing. As shown in FIG. 6, for a structure having 5 layers of NiFe of the form Ag(20 A)/NiFe(20 A)/Ag(40 A)]$_4$/NiFe(20 A)/Ag20 A) MR develops after annealing to achieve magnitudes of typically 5–6 percent. The applied magnetic field is in the plane of the structure and perpendicular to the sensing current. Arrow 58 indicate the ramping direction of the field. Typically, the resistance of the as-deposited structure decreased by about 15 percent after annealing at any temperature in the 300–400 degrees C. range, and there is no significant difference in the magnitudes of the MR for magnetic fields applied parallel and perependicular to the sense current direction indicates a persistent AMR effect of a magnitude of about 0.3–0.5 percent in both the unannealed and annealed structures. For the structure shown in FIG. 6, a maximum MR of 5.34 percent is observed after annealing at 335 degree C. with a width at half maximum of 22 Oe. While exhibiting a lower maximum value for MR, when annealed at 315 degrees C. the greatest change in resistance per unit field, 0.8 percent per Oe with a width at half maximum of about 5 Oe was observed.

Figure 7:
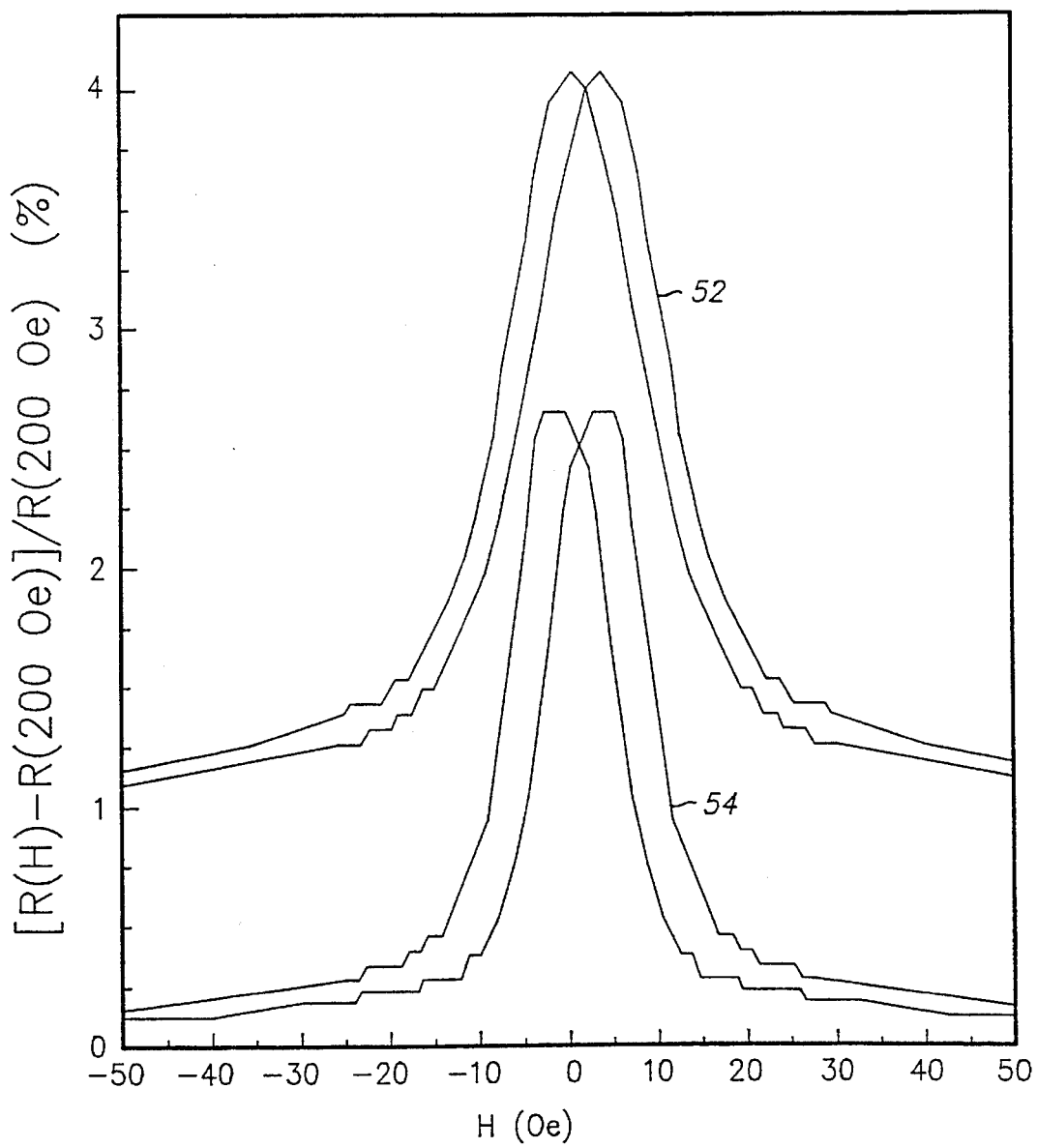
FIG. 7 is a graph which illustrates the magnetoresistance versus an applied magnetic field for a preferred embodiment of the magnetoresistive sensing element shown in FIG. 2.
Figure 8:
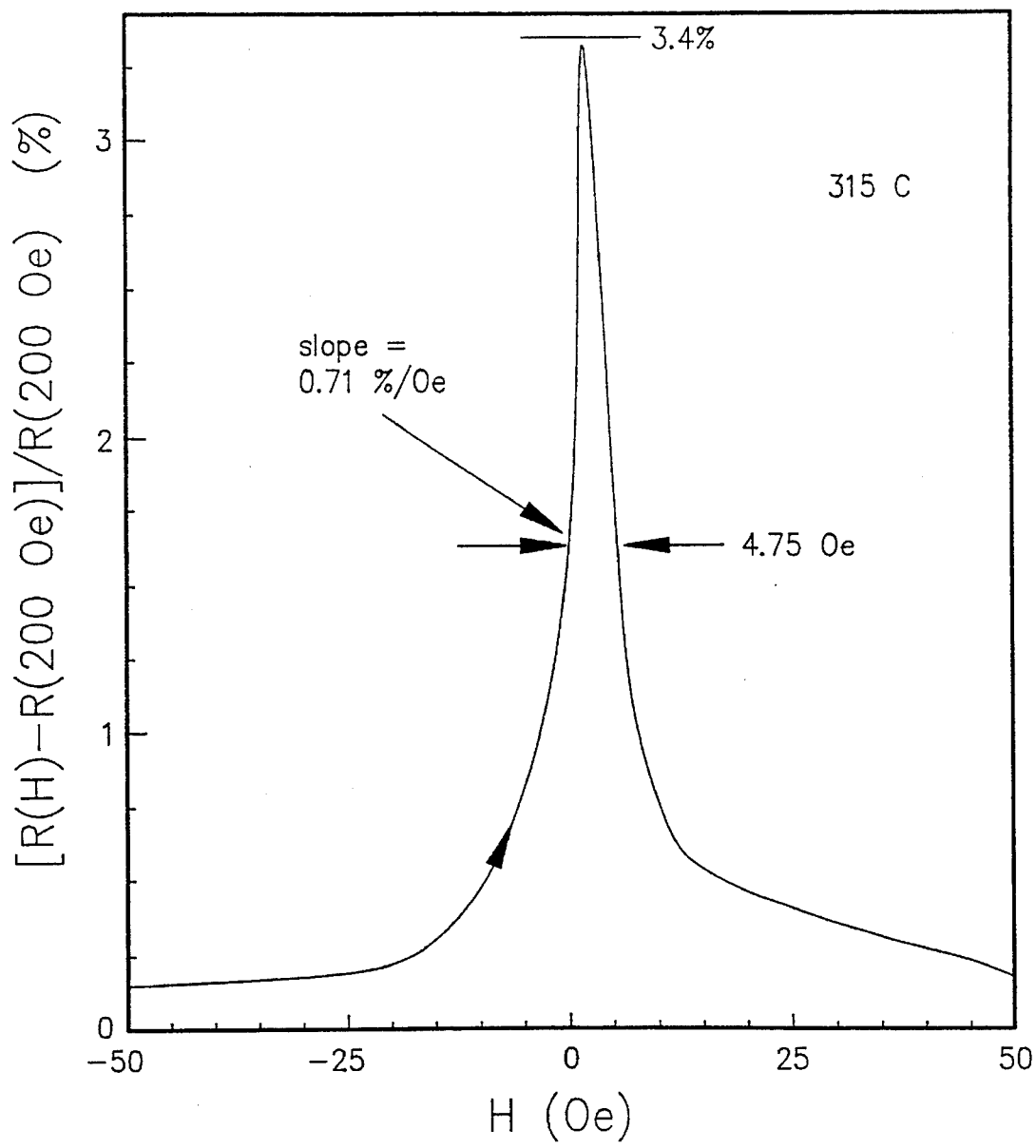
FIG. 8 is a graph which illustrates the magnetoresistance versus an applied magnetic field for a preferred embodiment of the magnetoresistive sensing element shown in FIG. 2.

Referring now also to FIGS. 7 and 8, FIG. 7 is a diagram illustrating the observed MR as a function of applied magnetic field for a granular multilayer structure 30 (as shown in FIG. 2) comprising 3 bilayers of NiFe(20 A)/Ag(40 A) sputter deposited on an oxidized Si substrate and annealed at 310 degrees C. The MR of the structure is defined as the ratio of the structure resistivity at the applied field, R(H), minus the resistivity of the structure at an applied field of 200 Oe, R(MIN), to the R(MIN). The structure exhibits a maximum value for the MR of approximately 3.0 percent with the curve 52 having a half-height width of approximately 10 Oe for fields applied along the hard axis. Similarly, the structure exhibits a maximum value for the MR of approximately 2.7 percent with the curve 54 having a half-height width of approximately 7 Oe for fields applied along the easy axis. FIG. 8 is a diagram illustrating the observed MR for a granular multilayer structure 30 comprising 5 bilayers of NiFe(20 A)/Ag(35 A) on an oxidized Si substrate and annealed at a temperature of 315 degrees C. This structure exhibits a maximum MR value of approximately 3.4 percent with the MR curve having a half-height width of approximately 4.75 Oe and a slope of 0.71 percent per Oe.

Figure 9:
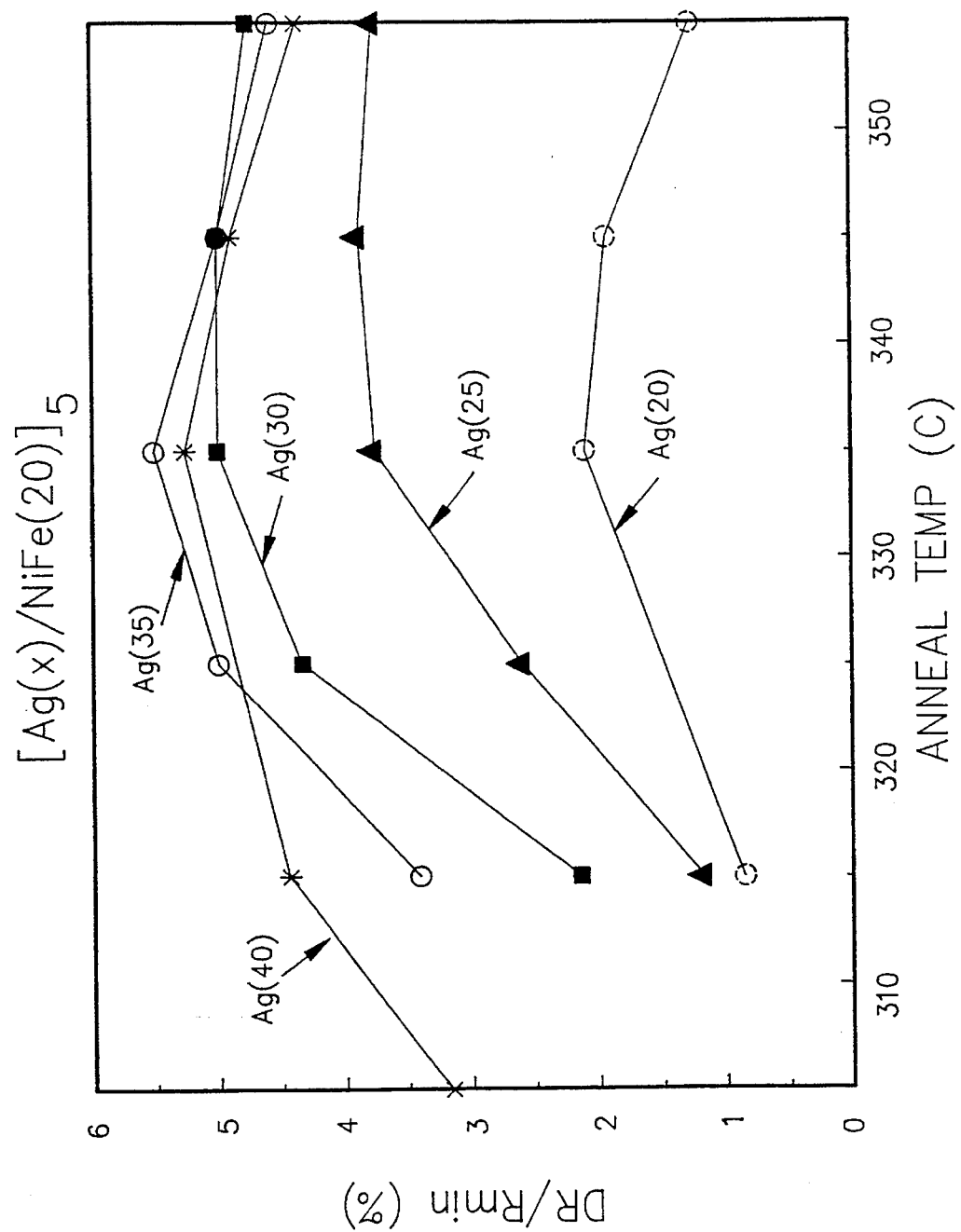
FIG. 9 is a graph which illustrates the magnetoresistance versus the anneal temperature as a function of silver layer thickness for a preferred embodiment of the magnetoresistive sensing element shown in FIG. 2.
Figure 10:
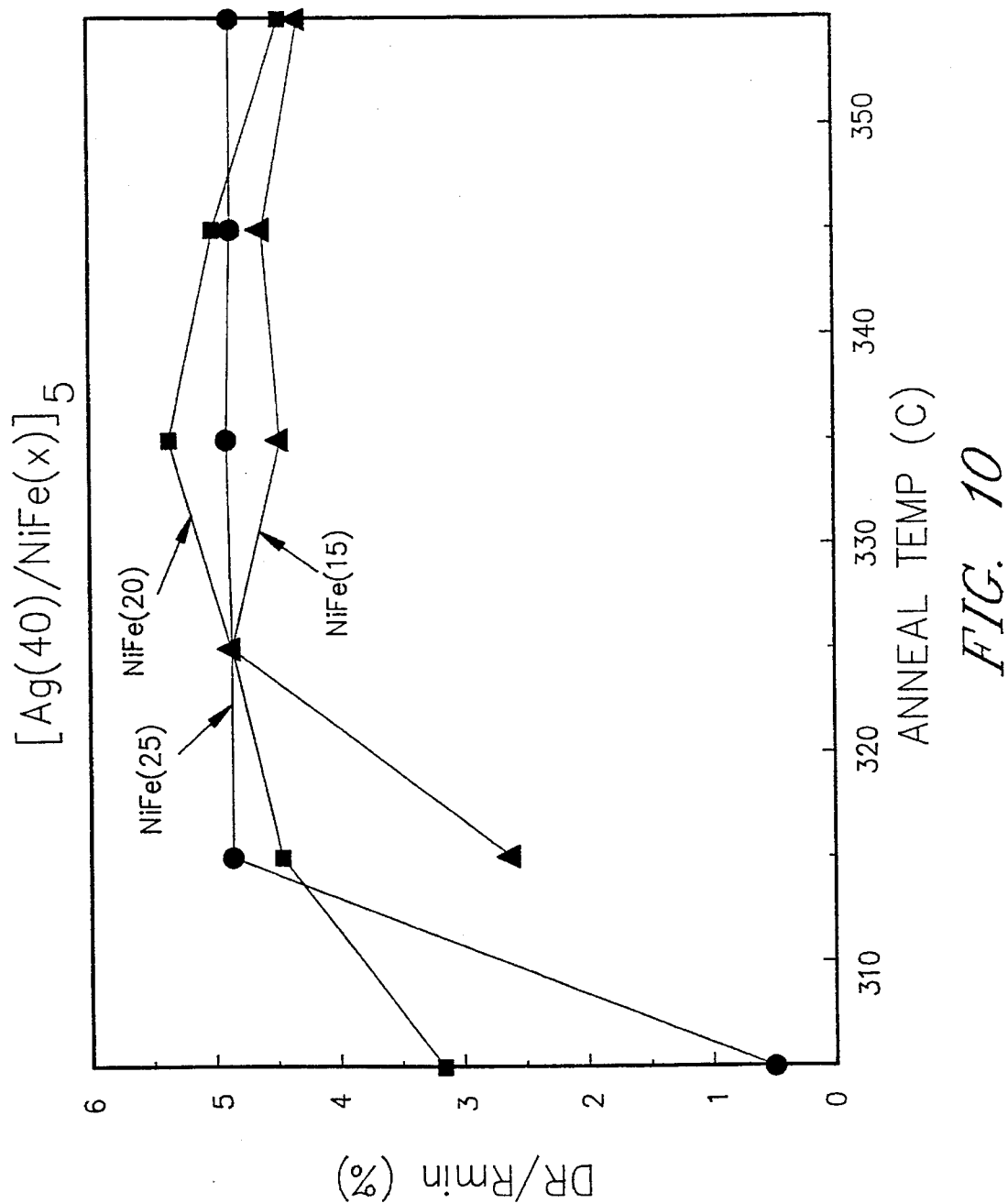
FIG. 10 is a graph which illustrates the magnetoresistance versus the anneal temperature as a function of nickel-iron layer thickness for a preferred embodiment of the magnetoresistive sensing element shown in FIG. 2.
Figure 11:
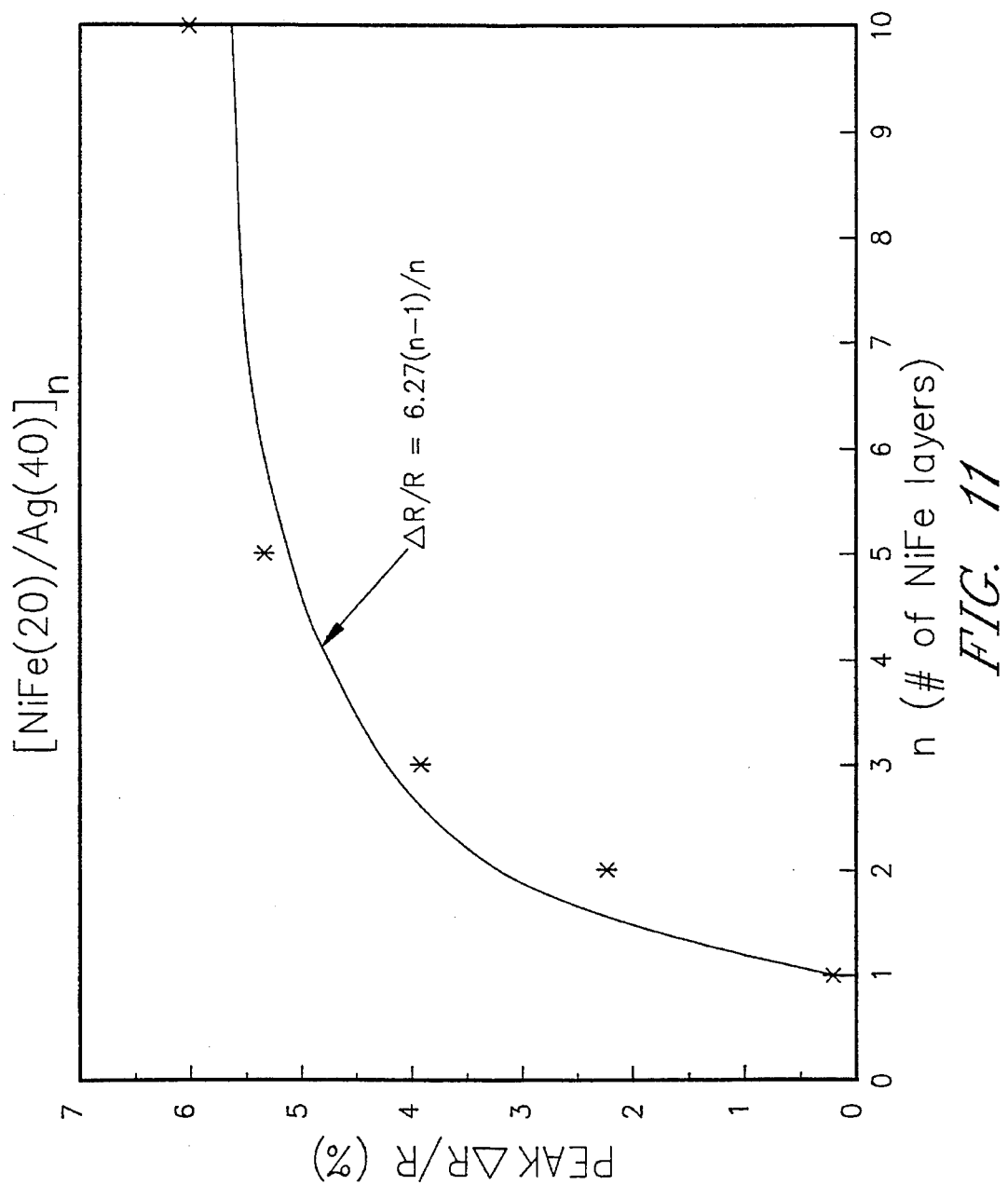
FIG. 11 is a graph which illustrates the magnetoresistance versus the number of bilayers for a preferred embodiment of the magnetoresistive sensing element shown in FIG. 2.
Figure 12:
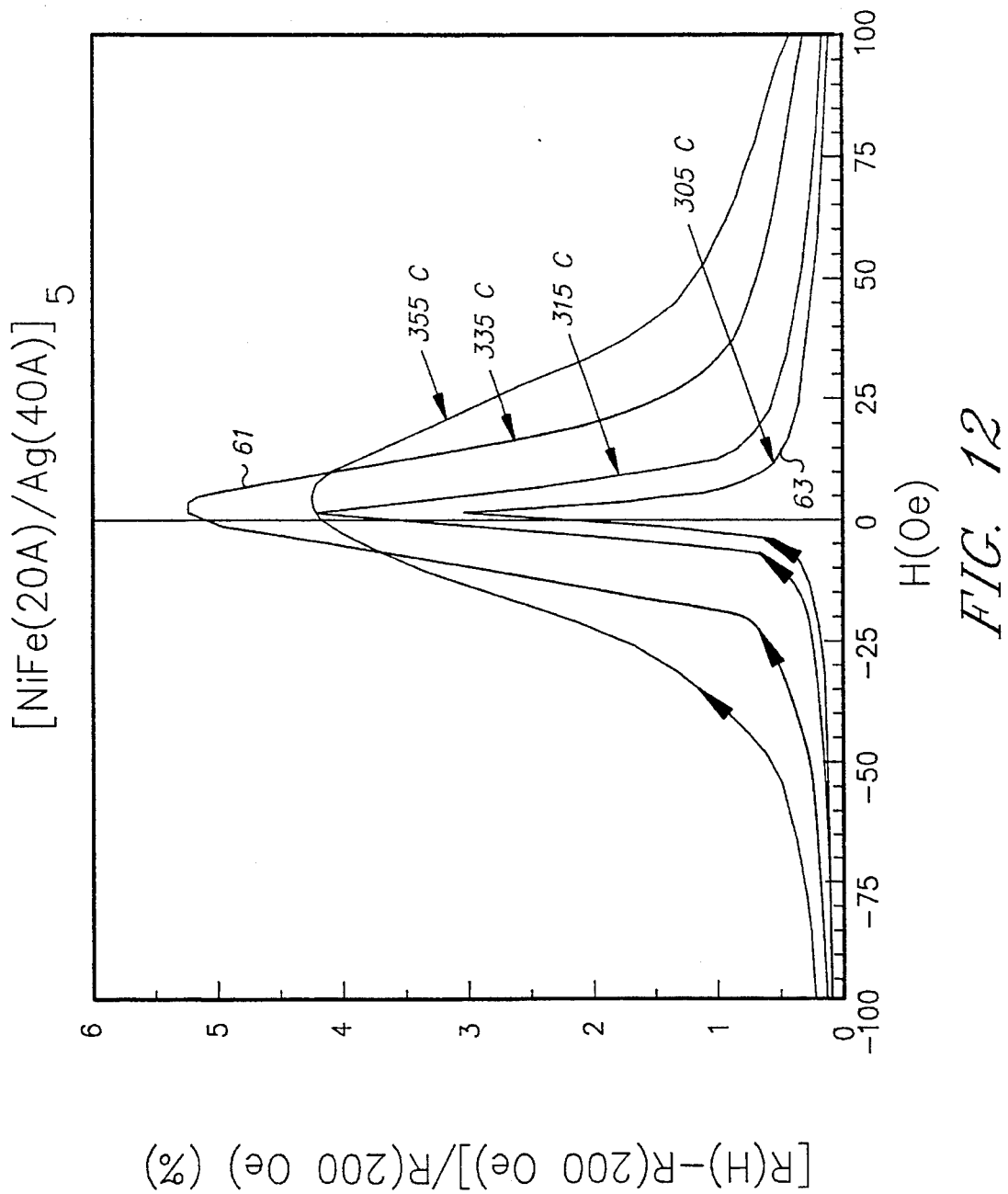
FIG. 12 is a graph which illustrates the magnetoresistance versus an applied magnetic field as a function of anneal temperature for a preferred embodiment of the magnetoresistive sensing element shown in FIG. 2.

Referring now also to FIGS. 9–12, the value of MR obtained for the granular multilayer structure 30 is dependent on a number of factors in addition to the materials chosen for the ferromagnetic and nonmagnetic layers. For example, the number of ferromagnetic/nonmagnetic bilayers, the thickness of the ferromagnetic layers, the thickness of the nonmagnetic layers and the temperature at which the structure 30 is annealed all affect the MR characteristics obtained for a specific structure. FIG. 9 is a diagram illustrating the value of MR versus anneal temperature as a function of the nonmagnetic layer thickness for a granular structure comprising 5 bilayers of Ag(t$_x$A)/NiFe(20 A) deposited on an oxidized Si substrate. Generally, the maximum MR for a given nonmagnetic layer thickness is obtained at an anneal temperature of about 335 degrees C., with the maximum MR obtained being about 5.3 percent for a nonmagnetic layer (Ag) thickness of 35 A. FIG. 10 is a diagram illustrating the value of MR versus anneal temperature as a function of the ferromagnetic layer thickness for a granular structure 30 comprising 5 bilayers of Ag(40 A)/NiFe(t$_x$ A) deposited on an oxidized Si substrate. Generally, the maximum MR value for a given thickness was achieved at an anneal temperature in the range of 315 to 335 degrees C., with a maximum MR value of about 5.3 percent observed for a ferromagnetic layer (NiFe) thickness of 20 A at 335 degrees C. FIG. 11 is a diagram illustrating the value of MR versus the number of ferromagnetic/nonmagnetic bilayers for a granular structure comprising bilayers of NiFe(20 A)/Ag(40 A) deposited on an oxidized Si substrate. The function starts with a relatively low MR value of about 0.2 percent for a single bilayer, deposited on a layer of Ag, increases rapidly to about 5.3 percent for 5 bilayers, and then flattens out having a value of about 6.1 percent for 10 bilayers. The low value for MR observed for a structure having a single bilayer compared to the relatively high MR values observed for multiple bilayers appears to indicate that scattering of conduction electrons at the particles 31 in the layers above and below the layer in which the conduction electrons originate is much more important than the scattering at particles 31 within the same layer. FIG. 12 is a diagram illustrating the MR value versus applied magnetic field as a function of anneal temperature for a granular structure 30 comprising 5 bilayers of NiFe(20 A)/Ag(40 A) deposited on an oxidized Si substrate. As would be expected from the curves shown by FIGS. 9 and 10, the maximum value 61 of about 5.3 percent for MR is observed at an anneal temperature of 335 degrees C. However, while the maximum observed MR value is lower, about 3.2 percent, at an anneal temperature of 305 degrees C., a much sharper characteristic curve 63 having a half-height width of less than 5 Oe is produced.

Figure 13:
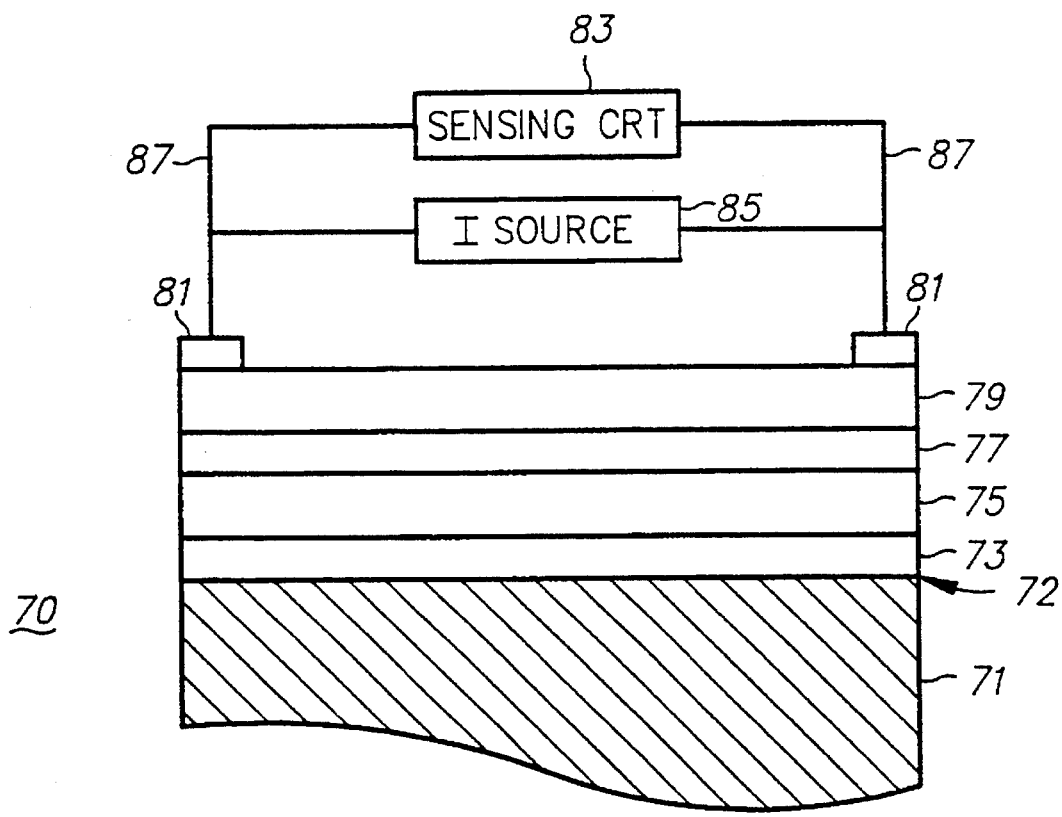
FIG. 13 is a sectional view of a preferred embodiment of a magnetoresistive magnetic sensor according to the principles of the present invention.

Referring now also to FIG. 13, an MR magnetic sensor incorporating a granular multilayer sensing element according to the principles of the present invention is shown. The MR sensor 70 comprises a bias layer 75 of a suitable magnetic material, a nonmagnetic spacer or isolation layer 77 and granular MR sensing layer 79 deposited on a suitable substrate 71. The substrate provides a major surface 72 which functions as a support or carrier for the subsequent layers making up the MR sensor. The substrate 71 may be glass, sapphire, quartz, magnesium oxide, silicon, silicon dioxide or other suitable material. An underlayer 73 is first deposited over the substrate surface 72. The purpose of the underlayer 73 is to optimize the texture, grain size and morphology of the subsequent layers 75, 77 and 79. The underlayer 73 must have a high resistivity to minimize electrical current shunting effects. Generally, nonmagnetic, high resistivity materials such as tantalum (Ta), ruthenium (Ru) or aluminum oxide, for example, are suitable materials.

The granular MR sensing layer 79 comprises multiple layers of flat, plate-like magnetic particles 31 embedded or suspended in a nonmagnetic conductive matrix 33 as described above with reference to FIGS. 2, 3 and 4. The granular structure is made up of multiple ferromagnetic/nonmagnetic bilayers formed despositing thin layers of a nonmagnetic material alternatively with thin layers of a ferromagnetic material and then annealing the structure at a temperature within the range of about 100 to 500 degrees C. While the granular MR sensing layer 79 preferably comprises 5 or 6 bilayers, MR values suitable for use in an MR sensor can be obtained with as few as 3 or more bilayers. As deposited, prior to the anneal cycle, the ferromagnetic layers are of a thickness in the range of about 10 to 30 A, while the thickness of the nonmagnetic layers are in the range of about 20 to 50 A. The ferromagnetic layer is preferably of NiFe, but can be of any suitable ferromagnetic material such as Ni, Co, Fe and ferromagnetic alloys based on Ni, Fe or Co, for example. The matrix 33 is a nonmagnetic, conductive material and should allow a long mean free path for conduction electrons in the material. After annealing, the layers of magnetic particles 31 are separated by a thickness of nonmagnetic, conductive material comparable to the mean free path for conduction electrons in the material, preferably in the range of about 10 to 50 A. Additionally, the ferromagnetic material and the matrix material are mutually immiscible. Alternatively, the magnetic and non-magnetic materials can be miscible or partially miscible under equilibrium conditions and processed in a controlled manner to limit interdiffusion. The matrix material is preferably Ag, but may be selected from the group consisting of Cu, Ru and Au and other conducting metals and alloys. Suitable semiconductor, conductive oxides and intermetallic compounds may also provide materials which are potential candidates.

Alloying the ferromagnetic material with a suitable material can enhance the breakup of the layer into particles during the anneal cycle. For example, alloying NiFe with 1 to 20 percent Ag or 0.1 to 20 percent lead (Pb) enhances the breakup of the NiFe layer in a Ag matrix. Since, for example, Ni-Pb and Fe-Pb have very limited mutual solubility, it appears that the Pb concentrates at the NiFe grain boundaries during processing thus enhancing the NiFe layer breakup and allowing the use of lower process temperatures. The use of NiFePb at lower process temperatures may allow the use of other materials, such as Cu, as the matrix material in which the rate of solubility with NiFe is less at lower temperatures than at higher temperatures.

The bias layer 75 provides a bias field for the MR sensing layer 79 to provide a linear response for the sensor. As is known in the art, the bias layer may be of a magnetically hard material (hard bias), such as CoPt or CoPtCr, for example, or of a magnetically soft material (soft bias), such as NiFe or NiFeRh, for example. The spacer layer 77 serves to magnetically decouple the bias layer 75 from the MR sensing layer 79 and also to optimize the texture, grain size and morphology of the MR sensing layer. The spacer layer 77 should be of a nonmagnetic, high resistivity material such as Ta, Zr, Ti, z Hf or other suitable material having the desired crystalline structure.

A preferred embodiment of the MR sensor 70 comprises an granular MR sensing layer 79 of 5 bilayers of NiFe(20 A)/Ag(35 A) annealed at 315 degrees C., a soft bias layer 75 of NiFe deposited on an underlayer 73 of $Al_2O_3$ and separated from the MR sensing layer 79 by a spacer layer 77 of Ta having a thickness of approximately 50 A. The sensor 70 is deposited on a ceramic substrate 71 by sputter deposition or other suitable deposition process as is known in the art. The thickness of the underlayer 73 preferably is in the range of 50 to 100 A. Conductor terminals 81 of Cu or other suitable material, such as Ag or Au, formed at opposite ends of the sensor 70 connect the sensor to current source 85 and signal sensing circuitry 83 via lead conductors 87. The current source 85 provides a sense current to the MR sensor 70 which senses the changes in resistance of the MR sensing element 79 when an external magnetic field is applied (for example, as described above with reference to FIG. 4). A capping layer (not shown) of a high resistivity material such as Ta or Zr, for example, can also be deposited over the MR sensor 70.

While the present invention has been particularly shown and described with reference to preferred embodiments thereof, it will be understood by those skilled in the art that various changes in form and detail may be made therein without departing from the spirit, scope and teaching of the invention. For example, while the preferred embodiment shown is described as an unshielded device, the MR sensor of the present invention is equally applicable to a shielded or flux-guided structure. Accordingly, the invention herein disclosed is to be considered merely as illustrative and limited in scope only as specified in the appended claims.

We claim:

1. A method for manufacturing a granular multilayer magnetoresistive device comprising the steps of:

deposition on a suitable substrate a plurality of bilayers, each said bilayer comprising a first layer of a nonmagnetic conductive material and a second layer of a ferromagnetic material; and annealing the resulting multilayer device, each said second layer of ferromagnetic material breaking up into a plurality of ferromagnetic particles during said annealing cycle, said nonmagnetic conductive material in said first layers flowing inbetween and surrounding said ferromagnetic particles.

2. The method of claim 1 wherein said nonmagnetic conductive material and said ferromagnetic material are immiscible.

3. The method of claim 1 wherein said ferromagnetic particles are generally flat, disc-like particles being spaced apart within each said layer by less than the mean free path length for conduction electrons in said nonmagnetic conductive material.

4. The method of claim 1 wherein the number of bilayers is selected from the range of 2 to 10 bilayers.

5. The method of claim 4 wherein the number of bilayers is 5.

6. The method of claim 1 wherein the step of annealing is at a temperature in the range of 100 to 500 degrees C.

7. The method of claim 1 wherein said first layers of ferromagnetic material are of a material selected from the group consisting of iron, cobalt, nickel, nickel-iron and ferromagnetic alloys based on iron, cobalt, nickel or nickel-iron.

8. The method of claim 7 wherein said first layers of ferromagnetic material are of nickel-iron.

9. The method of claim 7 wherein said first layers of ferromagnetic material are of nickel-iron-lead.

10. The method of claim 9 wherein the amount of lead contained in said nickel-iron-lead is selected from the range of 0.1 to 20 percent by weight.

11. The method of claim 7 wherein said first layers of ferromagnetic material are of nickel-iron-silver.

12. The method of claim 11 wherein the amount of silver contained in said nickel-iron-silver is selected from the range of 1 to 20 percent by weight.

13. The method of claim 1 wherein said first layers of ferromagnetic material have a thickness selected from the range of about 10 to 30 angstroms.

14. The method of claim 1 wherein said second layers of nonmagnetic conductive material have a thickness selected from the range of about 20 to 50 angstroms.

15. The method of claim 1 wherein the step of annealing includes the step of annealing said multilayer device in the present of an applied magnetic field oriented along the longitudinal axis of said multilayer device.

16. The method of claim 1 wherein said nonmagnetic, electrically conductive material is a material selected from the group consisting of silver, gold, copper and ruthenium.

17. The method of claim 16 wherein said nonmagnetic, electrically conductive material is silver.

* * * * *